United States Patent
Gwiasda et al.

[11] Patent Number: 5,845,838
[45] Date of Patent: Dec. 8, 1998

[54] PROCESS FOR REMELTING A CONTACT SURFACE METALLIZATION

[75] Inventors: Jörg Gwiasda, Berlin; Elke Zakel, Falkensee; Hans Hermann Oppermann, Berlin; Achim Kloeser, Berlin; Stefan Weiss, Berlin, all of Germany

[73] Assignee: Fraunhofer-Gesellschaft zur Forderung der Angewandten Forschung E.V., Munich, Germany

[21] Appl. No.: 860,313

[22] PCT Filed: Dec. 20, 1995

[86] PCT No.: PCT/DE95/01851

§ 371 Date: Nov. 21, 1997

§ 102(e) Date: Nov. 21, 1997

[87] PCT Pub. No.: WO96/24459

PCT Pub. Date: Aug. 15, 1996

[30] Foreign Application Priority Data

Feb. 10, 1995 [DE] Germany ............... 195 04 350.2

[51] Int. Cl.⁶ .................. H05K 3/34; H01L 21/60
[52] U.S. Cl. .................. 228/254; 228/220; 427/96
[58] Field of Search .................. 228/254, 219, 228/220; 29/874, 879; 427/96, 123

[56] References Cited

U.S. PATENT DOCUMENTS

| | | | |
|---|---|---|---|
| 4,022,371 | 5/1977 | Skarvinko et al. | 228/223 |
| 4,334,646 | 6/1982 | Campbell | 228/180 A |
| 5,194,137 | 3/1993 | Moore et al. | 205/125 |
| 5,616,164 | 4/1997 | Ochiai et al. | 134/2 |

FOREIGN PATENT DOCUMENTS

| | | | |
|---|---|---|---|
| 26 33 269 B1 | 8/1977 | Germany | B23K 1/12 |
| 1-205551 | 7/1989 | Japan | H01L 21/92 |
| 3-218645 | 9/1991 | Japan | H01L 21/60 |

OTHER PUBLICATIONS

Patent Abstracts of Japan; vol. 13, No. 509 (E–846).

Patent Abstracts of Japan; vol. 15, No. 502 (E–1147).

Patent Abstracts of Japan; vol. 17, No. 640 (E–1465).

*Primary Examiner*—Samuel M. Heinrich
*Attorney, Agent, or Firm*—Darby & Darby

[57] ABSTRACT

Process for remelting a contact surface metallization (13) applied to a substrate (10) in an inert or reducing medium, wherein the medium (18) is formed as alcoholic medium whose boiling point is the same as or above the melting point of the contact surface metallization (13), the medium (18) is applied to the contact surface metallization (13) applied to a contact surface (11, 12) of the substrate (10) outside the inert or reducing medium in such a way that the contact surface metallization (13) is screened with respect to the environment, and the medium (18) is tempered to a temperature which is the same as or higher than the melting point of the contact surface metallization (13).

7 Claims, 1 Drawing Sheet

PROCESS FOR REMELTING A CONTACT SURFACE METALLIZATION

FIELD OF THE INVENTION

The present invention relates to a process for remelting a contact surface metallization applied to a substrate in an inert or reducing medium.

BACKGROUND OF THE INVENTION

Processes of the above-mentioned kind are known, for example, as so-called reflow solder processes from microconnection technology. In these processes a contact surface metallization previously applied to the substrate is melted open again in order to achieve a connection with a structural component or, particularly in cases where the contact surface metallization has several components, a homogenization of the contact surface metallization. Particularly in the formation of so-called solder bumps on the terminal surfaces of chips, the remelting process also serves to form a more uniform bump geometry.

In order, when remelting, to prevent oxidation of the contact surface metallization or moreover to achieve a reduction of the contact surface metallization the remelting process is carried out in an inert or reducing atmosphere. An example of this is the so-called vapour phase soldering, in which, for remelting purposes, the contact surface metallization is heated in a saturated fluorine inert gas. This and other known processes require complex control of the heating because on the one hand it must be ensured that the melting point of the contact surface metallization is reached in order to make remelting possible and on the other hand the temperature must be limited in the upwards direction so as to prevent overheating of the contact surface metallization and of the substrate, such as a chip, to avoid damage.

From the complex demands described above, which arise in the known remelting processes, it is easy to conclude that the costs alone, which are associated with the provision of corresponding operating equipment, are extremely high.

BACKGROUND OF THE PRIOR ART

From JP 1-205 551 A a process for remelting a contact surface metallization is known in which the alloy desired for the contact surface metallization is already applied in wire from to the terminal surfaces by means of an ultrasonic bonder before the alcoholic medium is applied. This creates the requirement to provide the particular alloy desired for the contact surface metallization in wire form. Furthermore, because of the already formed alloy, the quality of the alloy formation can no longer be influenced.

From JP 3-218-645 A a temporary pre-contacting of a chip provided with bumps on a carrier substrate in known which makes use of holding forces which form as a result of a diffusion between a metallization of the substrate contacts and the bumps which occurs at elevated temperature. A wetting of the contact points with glycerol then takes place, followed by a connection process by means of remelting.

OBJECT OF THE INVENTION

The object of the invention is therefore to provide a process which simplifies the production of high-quality and reliable alloyed contact metallizations.

According to the invention the contact surface metallization is formed from at least two metallization components, initially present in a separate manner, which are remelted only in the alcoholic medium for the alloyed contact surface metallization.

Particularly when the boiling point of the medium is set in such a way that it is the same as the melting point of the allow which forms, the medium serves to form a system which is self-limiting with respect to temperature, since a corresponding evaporation of the medium prevents overheating of the contact surface metallization.

SUMMARY OF THE INVENTION

In the process according to the invention, during the remelting process the contact surface metallization is screened with respect to the environment in a liquid, alcoholic medium which is heated. The contact surface metallization may be heated via the medium and/or the substrate. In any event the alcoholic medium is selected or set in such a way that its boiling point is the same as or above the melting point of the contact surface metallization. Particularly when the boiling point of the medium is set in such a way that it is the same as the melting point of the substance, the medium serves to form a system which is self-limiting with respect to temperature, since a corresponding evaporation of the medium prevents overheating of the contact surface metallization.

The high interfacial tensions which can be determined in particular in the case of polyhydric alcohols provide for a formation of corresponding interfacial tensions in the medium so that particularly uniform geometries of the contact surface metallization arranged on the substrate can be achieved by means of the remelting process.

A further advantage which lies in the use of a liquid, alcoholic medium compared with the known gaseous screening media containing fluorine compounds for example is to be found in the water-solubility and the harmlessness to health, particularly in the case of evaporation of the medium. Furthermore, such liquid, alcoholic media can be disposed of simply and in an environmentally friendly manner without the need for special precautions or devices for this purpose.

When the contact surface metallization is formed with at least two components it is particularly advantageous if the boiling point of the medium is the same as or above the melting point of the alloy formed from the components. This ensures that even in the case of contact surface metallizations with several components, remelting is possible by using the process according to the invention.

In a preferred embodiment of the process the remelting process is carried out in a bath formed from the alcoholic medium, in which bath the substrate is dipped at least as far as is required for a wetting of the contact surface metallization. When a medium bath is used it is possible to introduce all the heat required for the remelting process into the contact surface metallization via the medium. To counteract the formation of heat sinks by the substrate it is particularly advantageous to dip the substrate into the bath as a whole, i.e. together with the contact surface metallization applied thereto and to be remelted.

When the tempering of the medium takes place via a heating of the substrate it is possible to apply the medium solely to the surface, particularly the surface of the contact surface metallization.

When the medium is heated until boiling point is reached and as much energy is continuously supplied during the remelting process as is required to maintain the boiling point, in addition to the supply of energy in a manner preventing overheating which has already been described in detail above, a particularly high degree of energy efficiency can be achieved so that the remelting process can be carried out with a minimum of energy supply.

When the medium and the contact surface metallization and/or the alloy which forms are matched to each other in such a way that there is as small as possible a temperature difference between the boiling point of the medium and the melting point of the contact surface metallization and/or of the alloy, the above-mentioned efficiency of the process may be further increased.

It also proves to be particularly advantageous when the boiling point of the medium is set via the pressure of the medium. This makes it possible to use one and the same medium for remelting substances with different melting points by adapting the boiling point to the melting point of the substance in question via a corresponding change, i.e. increase or reduction, of the medium pressure.

To increase the boiling point of the medium there is the possibility, for example, of carrying out the remelting process in an autoclave.

A preferred embodiment of the remelting process will be described below with the aid of the drawings, in which:

DETAILED DESCRIPTION OF THE INVENTION

Figure 1:
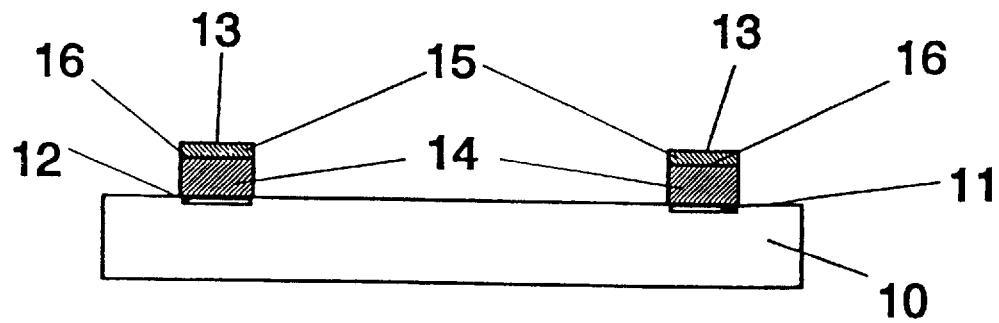
FIG. 1 shows a substrate with terminal surfaces on which contact metallizations are formed.

FIG. 1 shows a substrate, formed as chip 10 here, with terminal surfaces 11, 12, each of which is provided with a contact metallization 13. The contact metallizations 13 have different metallization components 14, 15 which in the example shown here have been electrodeposited on each other and/or on the terminal surfaces 11, 12 by sequential deposition in per se known manner. Apart from a boundary region 16 connecting the two metallization components 14, 15 together and in which an alloying has taken place as a result of diffusion effects during the deposition of the metallization component 15 on the metallization component 14, the metallization components 14, 15 are otherwise present in homogeneous form.

According to the first example the metallization component 14 consists of gold and the metallization component 15 of tin.

Figure 2:
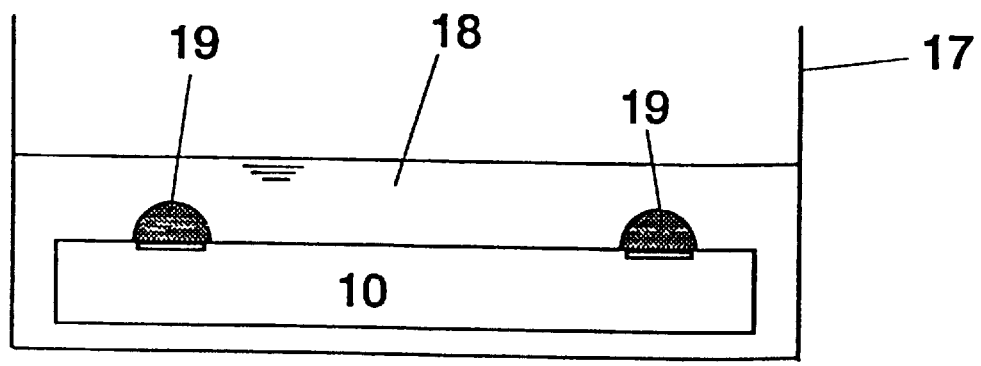
FIG. 2 shows the remelting of the contact metallizations in a bath comprising an alcoholic medium.

FIG. 2 shows a bath 17 of an alcoholic medium 18 for which glycerol was chosen as the medium for the above-mentioned gold/tin metallization component combination. Glycerol has a boiling point of 286° C. In the case of the above-mentioned contact surface metallization 13 the melting point of the alloy which forms is 278° C.

To perform the remelting process the bath 17 with the chip 10 dipped therein is heated to the boiling point of the glycerol and maintained at boiling point until the remelting process is completed and an alloy which is homogenized overall, i.e. not only in the boundary regions 16, has formed. This process may be observed through the bath surface.

As can be seen from FIG. 2, because of the high interfacial tension of the glycerol, the contact surface metallization 13 which was formed in a layer-like manner prior to being dipped in the bath 17 changes into contact bumps 19 which have approximately the shape of liquid meniscuses. The contact bumps 19 thus have a particularly uniform surface geometry.

As glycerol has no cationic or anionic residues the contact surface metallizations 13 which have remelted into the contact bumps 19 are also not contaminated with such residues.

In the example of the process described above, the bath 17 and the metallization components 14, 15 are matched to each other in such a way that there is only a minimum temperature difference between the boiling point of the glycerol and the melting point of the alloy which forms. The same bath 17, i.e. containing glycerol, may, however, also be used for contact surface metallizations with higher-melting alloys if the remelting of the contact surface metallizations 13 shown diagrammatically in FIG. 2 takes place inside an autoclave which receives the bath 17. The boiling point of glycerol may be increased to approx. 330° C., for example, at a pressure of 3.5 bars. Lead-rich contact metallizations may be remelted at this temperature. A further possibility of remelting such high-melting contact surface metallizations consists of using polyethylene glycol instead of glycerol, which has a similarly high boiling point at atmospheric pressure.

A further favourable pairing of an alcohol and a contact surface metallization consists of the combination of glycol with lead and tin as metallization components in eutectic composition.

It should be noted that the alcoholic media mentioned above by way of example may be used not only in pure form but also in combination with suitable dilution agents or solvents, in order to provide the alcoholic medium in which the remelting process is carried out.

After the remelting process and removal of the alcoholic medium from the contact bumps 19, by means of hot water or lower alcohol for example, a contacting of the chip, in the flip chip process for example, on a substrate or another electronic structural component may take place.

We claim:

1. A process for producing a contact bump by remelting a contact surface metallization applied to a substrate in an inert or reducing alcoholic medium whose boiling point is the same as or above the melting point of the contact surface metallization, wherein the medium is applied to the contact surface metallization applied to a contact surface of the substrate outside the inert or reducing medium in such a way that the contact surface metallization is screened with respect to the environment, and the medium is tempered to a temperature which is the same as or higher than the melting point of the contact surface metallization wherein the contact surface metallization is formed of at least two separate metallization components and the alloy formation takes place in alcoholic medium, wherein the boiling point of the medium is the same as or above the melting point of the forming allow of the metallization components.

2. A process according to claim 1, wherein the remelting process takes place in a bath formed of the alcoholic medium, in which bath the substrate is dipped at least as far as is required for a wetting of the contact surface metallization.

3. A process according to claim 1, wherein the medium is heated until the boiling point is reached and energy is supplied continuously during the remelting process to maintain the boiling point.

4. A process according to claim 1, wherein for the remelting process the substrate is heated until the boiling point of the medium is reached.

5. A process according to claim 1, wherein the medium and the contact surface metallization and the alloy forming from the metallization components are matched to each other in such a way that there is a small as possible a temperature difference between the boiling point of the medium and the melting point of the contact surface metallization and of the alloy.

6. A process according to claim 1, wherein the boiling point of the medium is set via the pressure of the medium.

7. A process according to claim 1, wherein in order to increase the boiling point of the medium the remelting process is carried out in an autoclave.

* * * * *